United States Patent [19]

Allen et al.

[11] 4,345,166

[45] Aug. 17, 1982

[54] CURRENT SOURCE HAVING SATURATION PROTECTION

[75] Inventors: Gordon H. Allen, Mesa; Robert A. Neidorff, Chandler, both of Ariz.

[73] Assignee: Motorola, Inc., Schaumburg, Ill.

[21] Appl. No.: 79,667

[22] Filed: Sep. 28, 1979

[51] Int. Cl.³ .................... H03F 3/18; H01L 29/72
[52] U.S. Cl. ..................... 307/296 R; 307/299 B; 357/35; 357/36
[58] Field of Search ............. 357/35, 36; 307/299 B, 307/296 R; 330/257

[56] References Cited

U.S. PATENT DOCUMENTS

| | | | |
|---|---|---|---|
| 3,579,059 | 5/1971 | Widlar | 357/36 |
| 3,810,006 | 5/1974 | Vittoz | 357/36 |
| 3,820,007 | 6/1974 | Schilling et al. | 357/36 |
| 3,829,718 | 8/1974 | Hart | 307/304 |
| 3,878,551 | 4/1975 | Callahan, Jr. | 357/36 |
| 3,958,267 | 5/1976 | Frederiksen et al. | 357/36 |
| 3,987,477 | 10/1976 | Krolik | 357/36 |
| 4,153,909 | 5/1979 | Dobkin | 357/36 |

FOREIGN PATENT DOCUMENTS 2344244 3/1975 Fed. Rep. of Germany ... 307/299 B

OTHER PUBLICATIONS

Motorola Semiconductor Data Library, vol. 6, Series B, pp. 3–163 (Motorola, Inc., Phoenix, Ariz., 1976).

Primary Examiner—William D. Larkins
Attorney, Agent, or Firm—Michael D. Bingham

[57] ABSTRACT

A circuit is disclosed for providing multiple output currents having magnitudes which are of a predetermined ratio of the magnitude of an input current. The circuit includes an input transistor and at least two output transistors. The emitters and bases of the input and two output transistors are connected in common with the emitters thereof being connected to a terminal at which is supplied a source of operating potential. The collectors are respectively coupled to individual utilization means. First and second additional transistors are provided having symmetrical structures with the bases thereof being connected to the bases of the output transistors and their emitters connected to the collector of the first output transistor. The collectors of the two output transistors are connected respectively to the collector of the input transistor and the collector of the second output transistor whereby all of any saturation current produced by the first output transistor becoming saturated is equally conducted between the two additional transistors to maintain the ratio of input and output currents.

9 Claims, 4 Drawing Figures

CURRENT SOURCE HAVING SATURATION PROTECTION

BACKGROUND OF THE INVENTION

This invention relates to current sources and more particularly to monolithic integrated current sources for providing source current to multiple load circuitry.

A contemporary current source utilized in monolithic integrated circuits for providing multiple output currents is such a source utilized in the MLM-124 Operational Amplifier manufactured by Motorola, Inc., for example. A comparative schematic illustrating this current source is disclosed in FIG. 1 of the subject specification labelled as Prior Art. As shown, this circuit comprises an input transistor and at least first and second sourcing transistors. A detailed discussion of the operation and significant problems related to this current source is described within the subject specification.

Basically, this prior art current source, when manufactured in integrated circuit form suffers from two disadvantages. First, if for some reason, one of the output sourcing transistors should become saturated, the matching of current ratios between the input transistor and output transistors is imbalanced and current output from the remaining source transistor does not remain in the correct ratio with regards to the input current. Second, a parasitic transistor may be formed between the substrate of the integrated circuit with the collector-base junction of the saturated sourcing transistor. This parasitic transistor allows current to be injected into the substrate. Thus, current is not only wasted but more power is consumed in the integrated circuit. Both of the aforementioned problems are undesirable.

Thus, a need exists for an improved current source incorporating the features of the prior art and having protection against saturation of one or more of the output sourcing devices.

SUMMARY OF THE INVENTION

Accordingly, it is an object of the present invention to provide an improved current source.

Another object of the present invention is to provide an improved current source comprising current sourcing output devices having protection against saturation of at least one of said devices.

Still another object is to provide an improved current source suitable for fabrication in integrated circuit form having circuitry for protecting against excessive power consumption in event of saturation of one of the output current sourcing transistors comprising said current source.

In accordance with the above and other objects there is provided a current source suitable for fabrication in integrated circuit form including an input transistor and at least first and second output current sourcing transistors. The base electrode of each of the aforesaid transistors being commonly connected. The emitters of these transistors are also commonly connected to a terminal at which is supplied a source of operating potential. The collector of the input transistor is connected with its base to an utilization circuit which sinks a predetermined current therefrom. The collectors of the first and second output transistors are connected to respective utilization circuits. The improvement comprising two additional transistors, the bases of each being connected to the commonly connected bases of the input and first and second output transistors. The emitters of the two additional transistors are connected to the collector of the first output transistor, with the collector of one of the two additional transistors being connected to the collector of the input transistor. The collector of the other one of the two additional transistors is connected to the collector of the second output transistor.

The two additional transistors having symmetrical structures wherein any saturation current produced, for example, by the first output transistor becoming saturated is equally split therebetween to maintain the magnitude of output current from the other additional transistor matched to the input current.

DETAILED DESCRIPTION OF THE PREFERRED EMBODIMENT

Figure 1:
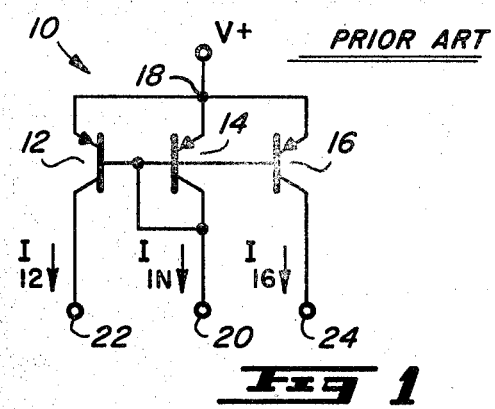
FIG. 1 is a schematic diagram of a prior art current source circuit.
Figure 2:
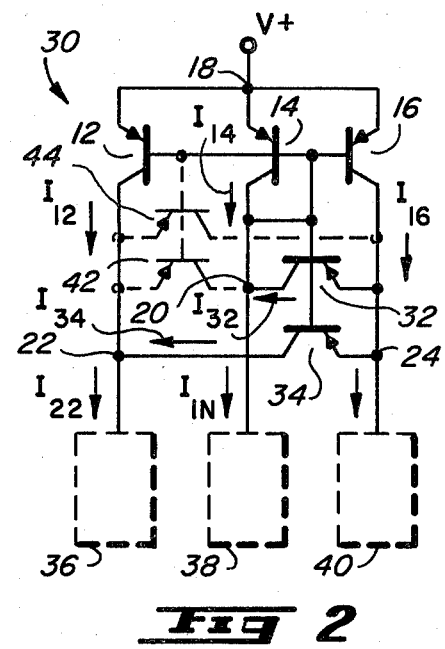
FIG. 2 is a schematic diagram of the current source of the present invention.

FIG. 1 shows a current source utilized in the prior art to provide output currents which may be scaled in magnitude with respect to the magnitude of an input current as will be explained. An example of an integrated circuit utilizing such a current source is the aforementioned MLM-124 Operational Amplifier manufactured by Motorola, Inc. Transistors 12-16 illustrated in FIG. 1 may correspond to transistors Q15, Q16 and Q19 of the MLM-124 device illustrated at page 3-163 of Volume 6/Series B of the "Motorola Semiconductor Data Library" published in 1976. As illustrated, the three transistors are connected in parallel with their respective emitter electrodes connected to terminal 18 at which is provided a source of operating potential V+. The bases of the three transistors are all connected in common, with the collector of transistor 14 being connected to its base.

In operation, the collector of transistor 14 would be coupled at terminal 20 to circuitry for sinking the collector current from the transistor as well as the base currents from transistors 12, 14 and 16. In general the collector of transistor 12 would be connected at terminal 22 to some utilization means for sinking the current from this transistor. Although transistors 12 and 16 may be considered output devices and transistor 14 the input device, for discussion purposes the output of the current source is considered to be taken at the collector of transistor 16, at terminal 24, for driving an output of the circuit. It is recognized that any number of current source outputs could be supplied from this type of circuit by connecting a plurality of additional transistors identical to transistor 16 or by using multi-collector devices. However, for simplicity of analysis, current source 10 has been shown as including only the three transistors 12-16.

It is assumed that the forward current gain of all three devices is high enough so that the base currents can be neglected. Furthermore, it is assumed that the base to emitter junctions of transistors 12, 14 and 16 are all equal in area so that the currents conducted by each of the transistors are equal although it is well recognized that by scaling either the base-emitter or collector-base regions of the respective devices different ratios of output currents at the collectors of transistors 12 and 16 can be obtained with respect to the input current appearing at the collector of transistor 14. From the foregoing assumptions it follows that when all three transistors are operated in a forward active region the currents $I_{12}$, $I_{14}$, and $I_{in}$ are all equal.

A problem arises in the above described prior art current source circuit when, for example, transistor 16 becomes saturated. This may happen if the voltage appearing at the collector of transistor 16 should become sufficiently high so as to forward bias the base to collector junction of the transistor. Additionally, transistor 16 can be caused to go into saturation by the collector becoming open circuited or disconnected from the load connected to terminal 24. What this means of course is that there is more than sufficient base drive to transistor 16 to support the collector current transistor 16 is able to source into its load. Thus, the effect of transistor 16 being in saturation is to cause a reinjection of collector current back into its base electrode. This reinjection current appears as additional base current from transistor 16. The effect is the same as if the current gain of transistor 16 has reduced to zero. As an example, if it is assumed that the same amount of collector current through transistor 12 flows through transistor 16, then the additional base current reinjected into the base of transistor 16 must assumed to be absorbed back through the collector base junction of transistor 14 and appear as an increase in magnitude of $I_{in}$. In fact, it can be shown that if transistor 16 goes into saturation, under the aforedescribed assumptions, the current in transistor 12 is reduced by a factor of approximately two with respect to the magnitude of current $I_{in}$ if the reverse beta $(\beta_r)$ of the respective devices is substantially less than the forward beta $(\beta_f)$. Thus, a mismatch occurs between the two currents which is not desirable.

There is yet another problem associated with the aforedescribed prior art circuit that arises when the circuit is fabricated in monolithic integrated circuit form. This problem arises from a parasitic PNP transistor which is formed, as is understood, by the integrated circuit structure between the base and collector of transistor 16 and the substrate of the integrated circuit, i.e., a PNP transistor is formed having its collector as the substrate and its base connected in common with the base of transistor 16 and the emitter thereof connected to the collector of transistor 16. Hence, when transistor 16 saturates the parasitic transistor is rendered conductive to source or inject current into the substrate. Although this slightly reduces the mismatch between $I_{in}$ and $I_{12}$ the power consumption of the total integrated circuit will be increased which may not be allowable. Further, this does not completely reduce the imbalance between the two currents.

Figure 3:
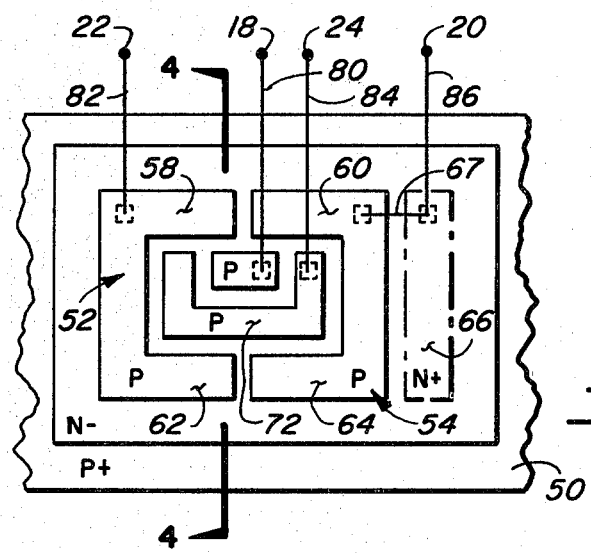
FIG. 3 is a topography view of an integrated circuit including the present invention showing the respective outlines of the semiconductor regions forming the current source circuit.

Turning now to the remaining Figures, there is shown current source 30 of the present invention that provides a solution to the aforedescribed problems of the prior art current source. It is understood components and nodes of current source 30 corresponding to those of FIG. 1 are identified with the same reference numerals. As shown, PNP transistors 32 and 34 have been added to constant current source 10 to overcome the problems associated with this circuit. The base electrodes of both transistors 32 and 34 are connected to the interconnected bases of transistors 12, 14 and 16. The emitters of both transistors 32 and 34 are connected to the collector of transistor 16 with the collector of transistor 32 being connected to the collector of transistor 14. The collector of transistor 34 is connected to the collector of transistor 12. It is assumed that both transistors 32 and 34 have symmetrical structures as seen in FIG. 3 and therefore will share equally any currents supplied to the bases thereof. Additionally it is assumed that the collector of transistor 12 is connected to a load 36 which produces a substantially constant collector current therefrom. Moreover, the collector of transistor 14 is also connected to some type of load or utilization means 38 which produces a substantially constant collector current therefrom. Hence, in the description of current source 30 which follows hereinafter it is assumed that the output of the circuit is taken at node 24 although it is realized that node 22 (the collector of transistor 12) could also be considered as an output of the circuit.

In operation, if load or utilization means 40 is removed from the output of current source 30 or if the magnitude of the voltage appearing at node 24 due to this load should increase to cause forward biasing the collector base junction of transistor 16 it is apparent that this transistor will then go into saturation. This will cause current flow through the collector-base junction of transistor 16 and simultaneously through the base-emitter junctions of transistors 32 and 34. A large proportion of the emitter current of transistors 32 and 34 reaches their respective collectors because of the high current gain of the devices. These collector currents are equal because of the symmetry of the transistors. If it is assumed that the base-collector current flowing through transistor 16 is small, with the dominant portion of the saturation current therefrom being split equally between transistors 32 and 34 it can be shown that:

$$I_{in} = I_{14} + I_{32} = I_{14} + \tfrac{1}{2}I_{SAT},$$

$$I_{22} = I_{12} + I_{34} = I_{12} + \tfrac{1}{2}I_{SAT}.$$

Thus, it can be shown that:

$$I_{in} = I_{22} \text{ (because } I_{12} = I_{14}; \text{ and } I_{32} = I_{34})$$

Therefore, even though transistor 16 should become saturated, the current ratio between transistors 12 and 14 remain constant due to the saturation current from transistor 16 being equally split between transistors 32 and 34. Thus, transistors 32 and 34 may be considered as an utilization means for maintaining a balance between input transistor 14 and output transistor 12 if output transistor 16 should become saturated. It is understood that circuit 30 can be comprised of complementary NPN transistors and still operate in the same manner as explained for the PNP transistors 12, 14, 16, 32 and 34.

It should be recognized that transistors 32 and 34 can be mirrored as shown by phantom transistors 42 and 44 to protect the circuit as aforedescribed if transistor 12 should become saturated, if this transistor was driving a load other than a constant current type load previously described. Additionally, if transistor 34 is made a symmetrical device transistor 44 would not be required.

Figure 4:
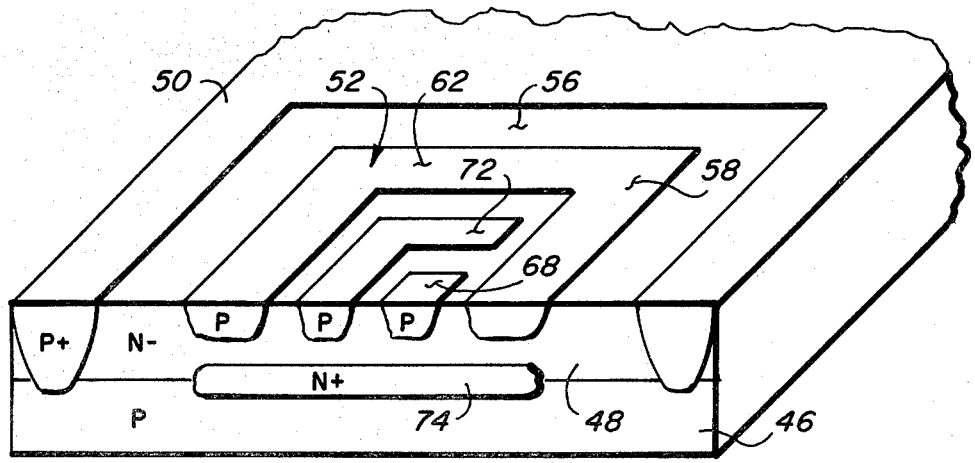
FIG. 4 is an enlarged cross-sectional view of the current source circuit of the present invention taken in the directions of arrows 4—4 of FIG. 3.

FIGS. 3 and 4 illustrate a novel manner of constructing circuit 30 in integrated circuit form, it is of course recognized that circuit 30 is only a portion of a total integrated circuit. Circuit 30 is fabricated using standard integrated circuit technology as is understood. A standard P type or P− type substrate 46 is constructed onto which epi layer 48 of N− type semiconductor material is grown. P+ isolation region 50 is formed in epi layer 48. Two P type collector regions 52 and 54 are symmetrically formed into N− base region 56. Regions 58 and 60 of diffusion layers 52 and 54 correspond to the collector areas of transistors 12 and 14 respectively; areas 62 and 64 correspond to the collectors of transistors 32 and 34 respectively. N+ region 66 formed in epi layer 48 comprises the base contact of transistor 14. Base contact 66 is physically connected by a metallic conductor 67 which is formed during the metallization process step as is understood. P type region 68 forms the common emitters of transistors 12, 14 and 16. The base regions for transistors 12 and 16 are formed in N− type epi-region 48 with the collector of transistor 16 being formed in P type region 72 which also forms the emitter of transistors 32 and 34 respectively. The connections between the aforedescribed transistor to respective nodes 18-24 may be made during said metallization process step when metallic layers 80-86 are formed.

In operation, as transistor 16 becomes saturated, transistors 32 and 34 are rendered conductive by their respective emitter to base junction being forward biased since these junctions are formed of the same region as the collector to base region of transistor 16. Furthermore, since transistors 32 and 34 are symmetrically formed in the semiconductor material they will supply equal collector to emitter currents.

By forming a buried layer 74 of N+ material, problems associated with the parasitic substrate PNP transistor, as described above, are reduced in two ways. First, by having the actual collection region of transistor 16 encircled with the collectors of transistors 12, 14, 32 and 34 rather than being isolated, any side injections of holes is collected by the collectors of these devices and actively used in the circuit function rather than being shunted to ground. Secondly, by enlarging the device to allow a larger area for N+ buried diffusion region 74, downward injection of hole current from the collector of transistor 16 towards P− substrate 46 is blocked and repelled. Thus, downward injection is blocked or at least severely restricted which prevents a parasitic PNP transistor from being formed. This prevents power dissipation into the substrate itself.

What has been described then is an improved current source comprising multiple sourcing transistors wherein the ratio between the magnitudes of input current and output currents is maintained even though one of the output sourcing transistors should become saturated. In addition, the above described circuit reduces power consumption in the device if said one of the output sourcing transistors should become saturated.

We claim:

1. A current source for providing multiple output currents comprising an input transistor and at least two output transistors, the emitters of the input and output transistors being connected to a power supply terminal, the bases being commonly connected, the collector of the input transistor being connected with the base thereof to an utilization means, the collectors of the two output transistors being connected to respective load means, and additional utilization means being responsive to a first one of the output transistors becoming saturated for maintaining a balance of current between the input transistor and the second one of the output transistors, said additional utilization means being coupled to the base and collector of the first output transistor and to the respective collectors of the input and the second output transistor.

2. The current source of claim 1 wherein the additional utilization means includes a first transistor having an emitter, base and collector, the emitter being coupled to the collector of the first output transistor, the base being coupled to the base of the first output transistor, the collector being coupled to the collector of the input transistor.

3. The current source of claim 2 wherein the additional utilization means includes a second transistor having an emitter, base and collector, the emitter being coupled to the collector of the first output transistor, the base being coupled to the base of the first output transistor, the collector being coupled to the collector of the second output transistor.

4. The current source of claim 3 wherein all of the transistors being PNP transistors.

5. A current source including an input transistor, and at least first and second output transistors each having a base, collector and emitter, the emitter of the input transistor being connected in common with the emitters of the at least first and second output transistors to a source of operating potential, the base of the input transistor being connected in common with the bases of the at least first and second output transistors with the base of the input transistor being connected to its collector, the collector of the input transistor being connected to an utilization circuit for establishing an input current of a first magnitude, the collectors of the first and second output transistors being coupled to respective utilization means for sourcing current thereto of a second magnitude, the improvement comprising third and fourth transistors each having a base, emitter and collector, with bases of said third and fourth transistors being commonly connected to the bases of the at least first and second output transistors and the base of the input transistor, the emitters of said third and fourth transistors being connected to the collector of the first output transistor, the collector of said third transistor being connected to the collector of the input transistor and the collector of the fourth transistor being connected to the collector of the second output transistor.

6. The current source of claim 5 wherein all of the transistors are PNP transistors.

7. A monolithic integrated current source circuit, comprising:
 a substrate of a first semiconductor material type;
 an epitaxial region of second semiconductor material type formed on said substrate and having an outward facing surface;
 a first region of said second semiconductor material type but of higher concentration formed both in said epitaxial region and said substrate;
 a second region of said first semiconductor material type formed in said epitaxial region and having an outward facing surface, said second region being formed in said epitaxial region in spaced relationship to said first region and having a surface area which is formed symmetrically about an axis bisecting said surface area in a direction normal thereto;
 a third region of said first semiconductor material type formed in said epitaxial region having an outward facing surface, said third region being formed symmetrically about said bisecting axis and surrounding a major portion of said second region;

fourth and fifth regions of said first semiconductor material type being formed in said epitaxial region having outward facing surfaces and being in mirrored relationship to each other, said fourth and fifth regions being formed symmetrically about said bisecting axis and surrounding both said third and said second regions; and conductive means for coupling, respectively, said second region to a terminal at which is supplied a source of operating potential, said third region to a first output, said fourth region to a second output, and said fifth region to an input.

8. The current source of claim 7 including a sixth region of same semiconductor type as said first region formed in said epitaxial region and being coupled with said fifth region to said input.

9. The current source of claim 8 wherein:
said first semiconductor material is P— type material; and
said second semiconductor material is N— type material.

* * * * *